Jan. 27, 1959 P. G. SULZER 2,871,356
FREQUENCY-STABILIZED OSCILLATOR
Filed July 14, 1955 2 Sheets-Sheet 1
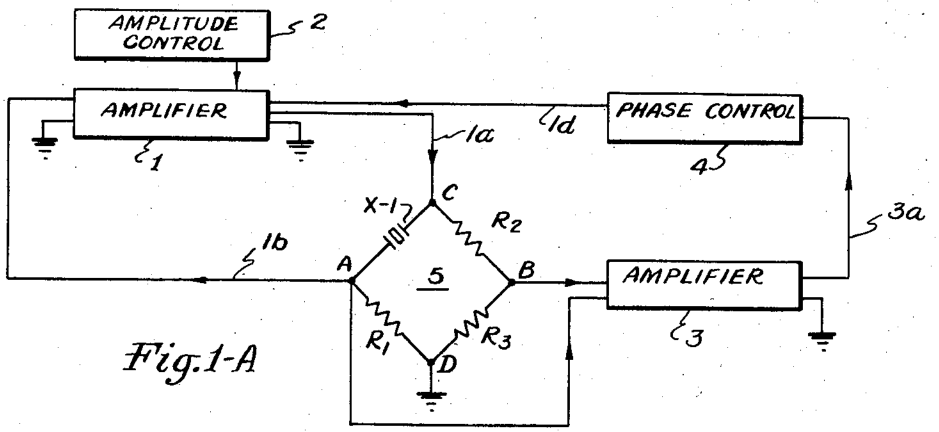
Fig.1-A
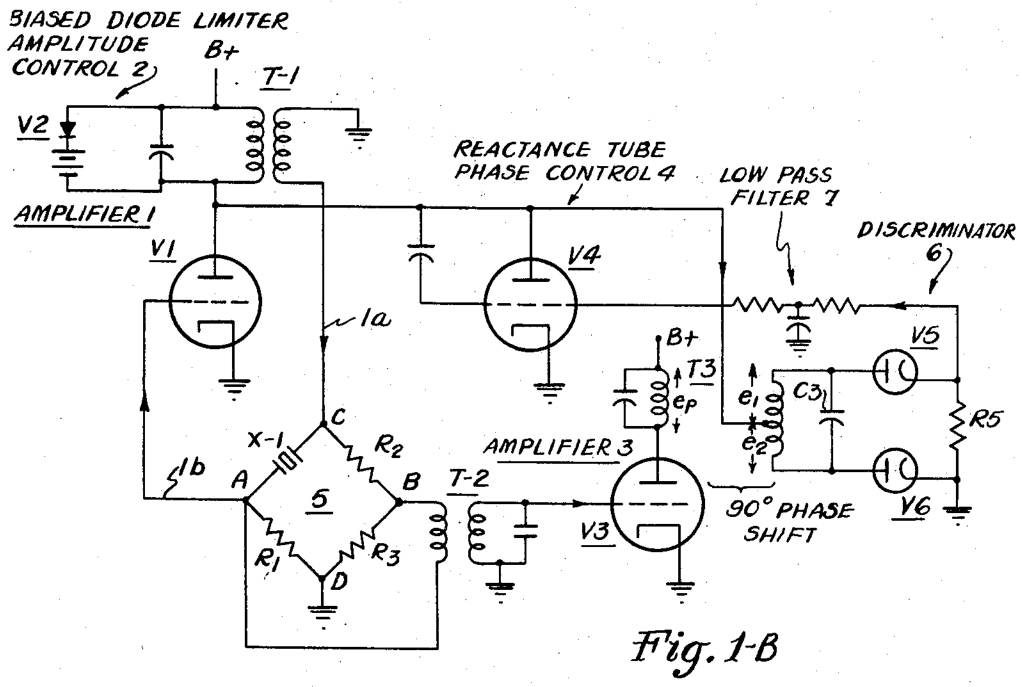
Fig. 1-B
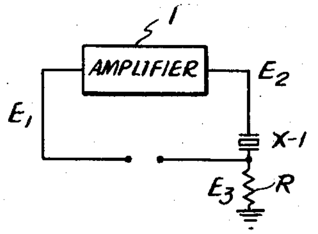
Fig. 1-C
INVENTOR
Peter G. Sulzer
BY Arthur Vinograd
ATTORNEY Jan. 27, 1959
P. G. SULZER
2,871,356
FREQUENCY-STABILIZED OSCILLATOR
Filed July 14, 1955
2 Sheets-Sheet 2
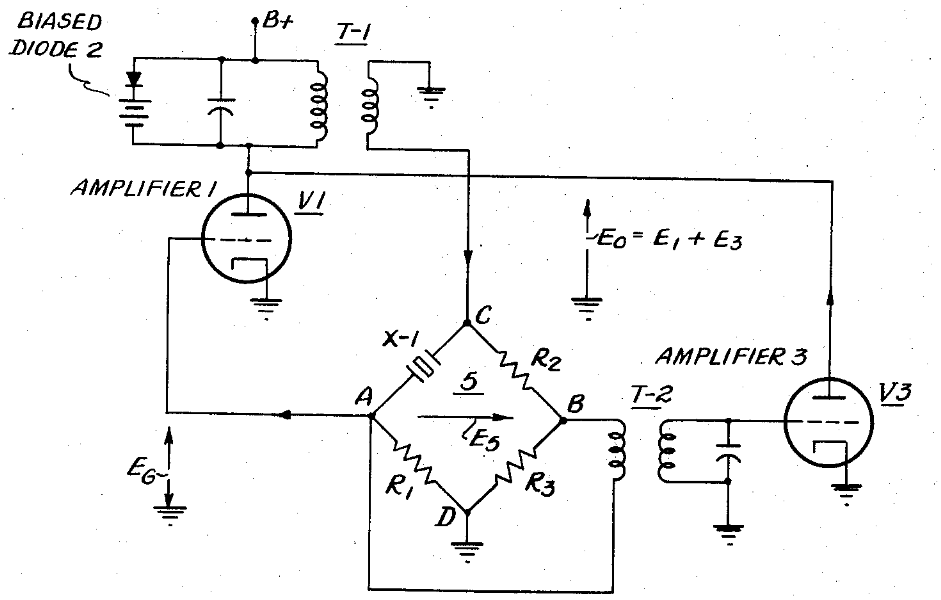
Fig. 2-A
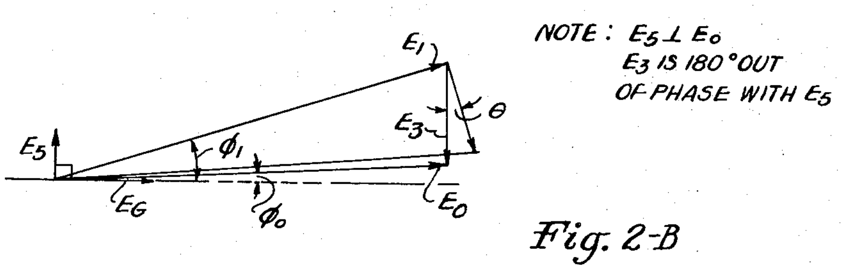
Fig. 2-B
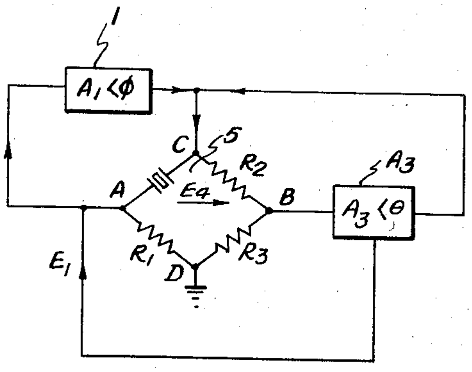
Fig. 2-C
INVENTOR
Peter G. Sulzer
BY Arthur Vinograd
ATTORNEY United States Patent Office 2,871,356

Patented Jan. 27, 1959

2,871,356

FREQUENCY-STABILIZED OSCILLATOR

Peter G. Sulzer, Kensington, Md., assignor to the United States of America as represented by the Secretary of Commerce Application July 14, 1955, Serial No. 522,188

5 Claims. (Cl. 250—36)

The present invention relates to stabilized oscillators and particularly contemplates a highly stable bridge-type oscillator circuit in which means are provided for minimizing frequency deviations due to phase shift effects.

Conventional oscillator circuits of the Pierce, Miller or Meacham-bridge type employ a frequency-determining source such as a resonant tank circuit or crystal unit, an amplifier and an amplitude limiter. In order to sustain oscillations, it is necessary, in such type of oscillator construction, that the gain of the amplifier be made equal to the losses due to attenuation. The amplitude limiter serves to maintain the oscillator in the straight portion of the tube characteristics. In the Pierce and Miller circuit, the crystal unit is connected directly between the amplifier output and input while in the Meacham-bridge circuit the crystal unit is connected in a bridge circuit so that positive feedback takes place through a lamp which serves as an amplitude limiter, while negative feedback occurs through the crystal unit. See L. A. Meacham, "The Bridge-Stabilized Oscillator," Proc. I. R. E., 26, 1278 (October 1938).

Conventional oscillator circuits employ a frequency determining network, an amplifying means and means for applying the output signal to the circuit input and in proper phase. Because of the need of an amplifier in order to sustain oscillations in practical circuits, phase shift effects are inherently introduced into the oscillator circuit and the resulting variance between the phase of the output and applied input signals results in frequency drift or deviation.

In the Meacham-bridge oscillator described in the referred to article, the effects of amplifier phase shift are decreased to some extent by the application of negative feedback. The amount of feedback that can be so employed is limited however because of instability and the possibility of parasitic oscillations which characterize feedback amplifier circuits. The amount of frequency stabilization obtainable by the use of feedback therefore only partially compensates for the effects of phase shifts caused by tube and component changes. The present invention overcomes the limitations to frequency stability inherent in previously existing oscillator control systems by the use of a high-gain amplifier of moderate phase stability to decrease the phase shift of another amplifier in a stable oscillator.

It is therefore an object of this invention to provide a highly stable oscillator in which the effect of phase shift on frequency stability is minimized.

Another object of this invention is to provide a highly stable oscillator construction in which frequency deviation due to phase shift effects are minimized by a phase sensitive error nulling device.

Other uses and advantages of the invention will become apparent upon reference to the specification and drawings.

Fig. 1A is a schematic diagram showing the operative principles of the present invention;

Fig. 1B is a circuit diagram showing a practical embodiment of a frequency-stabilized oscillator circuit employing the principles of this invention;

Fig. 1C is a diagram illustrating certain principles involved in connection with the invention;

Fig. 2A shows a modified embodiment of the present invention;

Fig. 2B is a vector diagram showing the relationship among the voltage signals in connection with Fig. 2A, and Fig. 2C is a block diagram showing some of the principles involved in connection with the modification of Fig. 2A.

The present invention is diagrammatically illustrated in Fig. 1A which shows an amplifier 1 which, together with a frequency determining means such as the crystal X–1 which is connected between the output and input leads *1a* and *1b* respectively of the amplifier, form an oscillator. A resistor R1 shunts the input terminal *1b* of the amplifier 1 to ground. Inasmuch as the amplifier 1 is grounded as shown, positive feedback will be obtained through the path including the crystal X1 and resistor R1. The amount of feedback obtainable will be a maximum at the series-resonant frequency of the crystal and the system therefore tends to oscillate at such frequency. The referred to crystal X1 and resistor R1 are further connected to resistors R2, R3 to form a bridge 5 as shown having input terminals C—D and output terminals A—B.

An amplitude control means 2 which may be in the form of a biased diode, automatic gain-control system or any conventional device tending to stabilize the output voltage of the amplifier 1 at a particular value is provided in the input circuit of amplifier 1 as shown.

Any phase shift which occurs in amplifier 1 will be reflected as a similar but opposite phase shift in the circuit comprising the crystal X1 and resistance R1 and frequency deviation therefore results.

Such effect is illustrated in connection with Fig. 1C which shows a bridge-type feedback oscillator similar to the oscillator portion of the network shown in Fig. 1A. Only the two branches X1 and R of the bridge are illustrated as being connected to the amplifier 1 to form an oscillator.

For the amplifier 1, $$\frac{E_2}{E_1}=A\angle\phi \qquad (1)$$

where $E_2$ and $E_1$ are the amplifier output and input respectively, A is the gain and $\phi$ represents the amplifier phase shift.

For the bridge circuit, $$\frac{E_3}{E_2}=\frac{R}{2R+jQ\mu R}=\frac{1}{2+jQ\mu} \qquad (2)$$

where Q is a measure of the selectivity of the resonator X1. Since $$E_3=E_1 \text{ then, } \frac{E_2}{E_1}=\frac{E_3}{E_2}=1$$

and $$\frac{A\angle\phi}{2+jQ\mu}=1 \qquad (3)$$

or $$A\cos\phi+jA\sin\phi=2+jQ\mu \qquad (4)$$

equating reals:

$$A=\frac{2}{\cos\phi}$$

equating imaginaries:

$$A\sin\phi=Q\mu$$

substituting:

$$2\tan\phi=Q\mu \text{ and } \mu=2\tan\frac{\phi}{Q}$$

but $$\mu=\frac{2\Delta f}{f}$$

$$\therefore=\frac{\Delta f}{f}=\frac{\tan \phi}{Q} \quad (5)$$

In accordance with the objectives of this invention such phase-shift effects are substantially decreased in the following-described manner.

As shown in Fig. 1A, the resistors R2 and R3 are connected across the output terminal *1a* of the amplifier 1 to ground and the terminal B between these resistors, and terminal A of the bridge are connected to the input of a second high-gain amplifier 3 having moderate phase stability. The output of amplifier 3 is, in turn, applied through conductor *3a* to the input of a phase-control mechanism 4, the output of which is connected as an input *1d* to the amplifier 1 in a manner such that it will control the phase shift of amplifier 1 as will be described. In accordance with the described construction, the amplifier 1 is driven by a differential input, i. e., the output of bridge 5, through conductor *1b* and the output of phase controller 4 through conductor *1d*, and the output of the amplifier 1 is fed back to the input through the bridge 5, amplifier 3, and controller 4.

The described frequency-stabilized oscillator is based on an error detection and correction system of operation. Specifically, if no phase shift exists in the oscillator amplifier 1, the crystal X1 will have no reactive component at resonance and will behave as a pure resistance. A state of balance can therefore be obtained in the bridge circuit 5 by the proper choice of the resistors R1, R2, and R3. In such event, no output signal will be obtained from amplifier 3 and the phase control 4 will not be actuated.

If, due to a reactance change in the amplifier 1, a phase shift is manifested thereby, the impedance of the crystal X1 will include a reactive component. Under such conditions, the bridge 5 will be unbalanced and an output will be manifested across the terminals A and B of the bridge which will be 90° out of phase with respect to the bridge input. After amplification in amplifier 3, such output signal is applied to the phase control network 4 to decrease the existing phase shift in the amplifier 1 by applying a reaction effect as will be described. Such reduction in the phase shift of amplifier 1 is limited only by such factors as thermal noise from the bridge 5 and the inherent tube noise in amplifier 3 and not by feedback considerations.

The principles symbolically shown in connection with Fig. 1 may be specifically implemented in the circuit arrangement shown in Fig. 1B corresponding parts being identified by like reference numbers.

The referred to amplifier 1 may comprise an amplifier tube V1, the plate of which is transformer coupled through a transformer T1 to the input terminals C and D of the bridge circuit 5. Terminal A of the bridge is connected through the conductor *1b* to the input grid of tube V1, the cathode of which is grounded. Output terminals A and B of the bridge are connected to the primary of a transformer T2 the secondary of which is connected as an input to the amplifier tube V3. The cathode of V3 is grounded and the plate is connected to a source of positive potential through the suitably by-passed primary winding of a transformer T3.

The transformer T3 includes a center tapped secondary which forms part of a discriminator 6. The opposite terminals of the secondary are connected to diodes V5, V6 and to a capacitor C3. The cathodes of the diodes V5, V6 are connected across resistor R5, the cathode of V6 being grounded. The discriminator output is in turn connected through a low-pass filter 7 to the input of a reactance tube V4 comprising the phase controller 4 for regulating the frequency of the oscillator. The plates of V1 and V4 are connected to the center tap of the discriminator transformer T3 and to the primary of T1, the cathodes being grounded.

The amplitude control 2, comprises a diode V2 which is biased as shown from a potential source and paralleled to the primary of the transformer T1 of the amplifier.

In accordance with the circuit shown in Fig. 1B, any output obtainable from terminals A and B of the bridge circuit 5 is amplified in the high-gain amplifier V3. The output of the amplifier V3 is coupled through transformer T3 to the discriminator circuit 6. Since the output of the bridge 5 is 90° out of phase with the input to the bridge it is necessary to provide a 90° phase shift between the output of amplifier V3 and the discriminator. The secondary of T3 and the capacitor C3 form a series resonant circuit at the oscillator frequency producing a 90° phase shift between the voltage $e_p$ in the primary and the secondary winding voltages $e_1$ and $e_2$ respectively. Since the center tap of the discriminator transformer is also connected to the output of amplifier V1 it will be apparent that the voltage applied to each of the diodes V5 and V6 will be the vector sums of the voltage from V1 and $e_1$ and $e_2$ respectively. Any phase shift manifested in the amplifier V1 will therefore produce a control signal across the resistor R5 in the discriminator circuit 6. Such control signal is applied through the low-pass filter network 7 to the input of the reactance tube V4 which acts as the frequency control tube for the oscillator in a conventional manner. Since the magnitude of the plate current component in reactance tube V4 is determined by the magnitude and polarity of the control signal across R5, and the latter signal is, in turn, determined by the character of the initiating phase shift occurring in amplifier V1, the resulting component of plate current in V4 therefore appears as a reactance load on amplifier V1. Such reactive effect substantially reduces the phase shift effects originating in the tube V1. If the sense, or direction of the amplifier phase shift changes, the sense of the bridge-output voltage will also change, reversing the polarity of the direct-current output of the discriminator. Accordingly, a bias of proper polarity will be applied to the reactance tube V4 to compensate for the phase shift in amplifier 1. In other words, in accordance with the current of Fig. 1B, the A. C. plate current in V4 always lags the voltage across the primary of T1. Actually, T1 is detuned slightly to compensate for the reactive components of the plate current in V4 in the absence of any voltage across R5. A plus or minus voltage across R5 will then produce a net inductive or capacitive reactance across T1.

The frequency stability of such described system is limited only by such factors as thermal and tube noise, and not by the stability considerations inherent in a feedback type of amplifier arrangement. That is, the feedback stability considerations do not govern the performance of the oscillator because the output of the amplifier 3 is not connected directly to its input to provide feedback in the ordinary sense of the word. The output of the amplifier is rather fed back through the frequency control system described, and therefore, any small phase shift which might occur in the amplifier tube V3 and associated circuit will only produce a change in the magnitude of the phase control obtained, and will not, therefore in itself, result in a first-order frequency change as would occur in the type of conventional feedback system previously referred to.

The particular embodiment illustrated and described in connection with Fig. 1B can of course be readily modified by the use of equivalent components. For example, while a single stage of amplification has been indicated in connection with the two amplifiers, one or more tube or transistor stages may be employed. The biased diode type of limiter V2 may be replaced with an automatic-gain-control system or a nonlinear device such as a Thyrite, or a Zener diode may be employed. The reactance tube V4 may be replaced by a saturable reactor or a nonlinear, voltage-controlled capacitor, an electromechanical variable capacitor or inductor. While a crystal resonator has been described, any equivalent tank circuit such as a magnetostriction resonator, or turned L–C circuit may be used. Moreover, as will be apparent, the reactance tube, or other control device can be connected to a part of the amplifier tube V1 other than its output.

A second embodiment of the invention is shown in Fig. 2A. In this modification the discriminator and reactance tubes are eliminated, and the output of the amplifier 3 is connected directly to the output of amplifier 1.

The circuit shown in Fig. 2A is the same as that described in connection with Fig. 1B, with the exception that the output from the amplifier tube V3 is connected directly to the output of the amplifier tube V1. As in the case of the embodiment of Fig. 1B, when the bridge 5 is balanced, the amplifier V3 will not function. If, however, a phase shift $\phi$, is associated with the amplifier V1, the crystal in the bridge circuit will exhibit a reactive component and the output manifested by the bridge will, for small phase angles, therefore be 90° out of phase with the output of V1. Under such conditions the component of plate current in amplifier V3 will either lead or lag the input to the bridge 5. The tube V3 accordingly appears as a reactive load on amplifier V1 and substantially decreases the phase-shift effects in the latter.

The operation of the circuit embodiment shown in Fig. 2A is illustrated by the vector representative of Fig. 2B in which:

$E_G$=the voltage signal applied to the grid on input of amplifier V1
$E_1$=output of amplifier V1
$E_5$=output of the bridge 5
$E_3$=output of the amplifier V3
$E_0=E_1+E_3$
$\phi_1$=phase shift angle occurring in amplifier V1, and
$\phi$=phase angle of amplifier 3

As is conventional the input signal $E_G$ establishes the reference vector, positive angles being measured counterclockwise with respect thereto. The vector $E_1$ represents the output from amplifier V1 shifted through an angle $\phi_1$ due to phase shift effects in V1. The vector $E_5$ representing the output of bridge 5 is 90° out of phase with $E_0$ as described and the vector $E_3$ is therefore drawn at 180° with respect to $E_5$. The combined outputs $E_1$ and $E_3$ of the amplifiers V1 and V3 respectively is indicated by the vector $E_0$ which is the vector sum of $E_1$ and $E_3$. As indicated in the diagram, the phase angle $\phi_0$ of the resultant $E_0$ is considerably less than $\phi_1$. Fig. 2B further shows that variations in the load impedance angle $\theta$ produces practically no change in the resulting phase angle $\phi_0$, as illustrated by the broken lines in the vector diagram.

The degree of stabilization obtainable may be derived in the following manner:

Fig. 2C symbolically illustrates the basic oscillator circuit of Fig. 2A which has been stabilized in accordance with the principles of this invention. The output A of the oscillator amplifier 1, having a phase angle $\phi$ is connected to the bridge 5. The output of the bridge is applied to the amplifier A3 which has a phase angle $\theta$. For the circuit arrangement of Fig. 2C, $$\frac{E_5}{E_0}=j\tfrac{1}{4}Q\mu \qquad (6)$$

where $$\mu=\frac{\omega}{\omega_0}-\frac{\omega_0}{\omega}$$

and $$\omega=2\pi f$$

and $$E_0=A_1<\phi E_G-jA_3<\theta.\tfrac{1}{4}Q\mu E_0 \qquad (7)$$

or $$E_0=A_1<\phi\cdot\frac{E_0}{2+jQ\mu}-jA_8<\theta\cdot\tfrac{1}{4}Q\mu E_0 \qquad (8)$$

from which $$2+jQ\mu=A_1<\phi-(jA_2<\theta.\tfrac{1}{4}Q\mu)(2+jQ\mu) \qquad (9)$$

let $\theta=0$ $$2+jQ\mu=|A_1|\cos\phi+j|A_1|\sin\phi-jA_2.\tfrac{1}{2}Q\mu+A_2\cdot\tfrac{1}{4}Q^2\mu^2 \qquad (10)$$

equating reals, $$2=|A_1|\cos\phi+\tfrac{1}{4}A_2Q^2\mu^2 \qquad (11)$$

or $$|A_1|=\frac{2-\tfrac{1}{4}A_2Q^2\mu^2}{\cos\phi} \qquad (12)$$

equating imaginaries:

$$Q\mu=|A_1|\sin\phi-A_3\cdot\tfrac{1}{2}Q\mu \qquad (13)$$

$$Q\mu=2\tan\phi-\tfrac{1}{4}A_3Q^2\mu^2\tan\phi-A_2\cdot\tfrac{1}{2}Q\mu \qquad (14)$$

$$Q\mu(1+\tfrac{1}{2}A_3)+Q^2\mu^2(\tfrac{1}{4}A_3\tan\phi)=2\tan\phi \qquad (15)$$

if $$\tan\phi<1 \text{ and } Q\mu<1$$

$$\mu\approx\frac{2\tan\phi}{Q[1+\tfrac{1}{2}A_3]} \qquad (16)$$

since $$\mu\approx 2\frac{\Delta f}{f}$$

then $$\frac{\Delta f}{f}\approx\frac{\tan\phi}{Q[1+\tfrac{1}{2}A_3]} \qquad (17)$$

Since $\theta$ is the phase angle of amplifier $A_3$ $$2+jQ\mu=A_1<\phi-j\tfrac{1}{4}Q\mu A_3<\phi(2+jQ\mu) \qquad (18)$$

from which $$2+jQ\mu=|A_1|\cos\phi+j|A_1|\sin\phi+\tfrac{1}{4}|A_3|Q\mu(Q\mu\cos\phi+2\sin\phi)+j\tfrac{1}{4}|A_3|Q\mu(Q\mu\sin\theta-2\cos\theta) \qquad (19)$$

equating reals:

$$A_1=\frac{2-\tfrac{1}{4}A_3Q\mu(Q\mu\cos\theta+2\sin\theta)}{\cos\phi} \qquad (20)$$

equating imaginaries:

$$Q\mu=|A_1|\sin\phi+\tfrac{1}{4}|A_3|Q\mu(Q\mu\sin\theta-2\cos\theta) \qquad (21)$$

Substituting the above-derived value for $A_1$, $$Q\mu=\tan\phi[2-\tfrac{1}{4}|A_3|Q\mu(Q\mu\cos\theta+2\sin\theta)]+\tfrac{1}{4}|A_3|Q\mu(Q\mu\sin\theta-2\cos\theta) \qquad (22)$$

from which it can be shown that $$\mu\approx\frac{2\tan\phi}{Q[1+\tfrac{1}{2}A_3\cos\theta]} \qquad (23)$$

since $$\mu=2\frac{\Delta f}{f}$$

then $$\frac{\Delta f}{f}=\frac{\tan\phi}{Q[1+\tfrac{1}{2}A_3\cos\theta]} \qquad (24)$$

It can be seen from the above equation that, for large values of $A_3$, the stabilization is proportional to $A_3$, while small values of $\theta$ have little effect. It is easy to keep $\phi_1$ small because little voltage gain is required in amplifier 1.

The use of an auxiliary amplifier in the above-discussed modification results in a significant improvement in frequency stability as compared to a conventional bridge-type oscillator such as described in the referred to Meacham publication. In the Meacham type oscillator, all of the amplification takes place in a single amplifier, the output of which is connected back to its input through a bridge containing the crystal unit, lamp, and resistor arms. As the output of the amplifier increases, the increased lamp resistance tends to balance the bridge, until the product of the amplifier gain and the bridge transmission equals unity. Under such conditions, the expression for frequency deviation (assuming an equal-arm bridge) becomes:

$$\frac{\Delta f}{f}=\frac{2 \sin \phi}{QA} \qquad (25)$$

where $\Delta f$, $f$, and Q are as defined above, and $\phi$ is the phase shift of an amplifier having a gain A. It will be apparent from such equation that the frequency deviation is directly proportional to the phase angle, and the effect of increasing A in order to reduce $\Delta f$ must also increase the value of $\phi$, a result which is obviated by the modification described in connection with Fig. 2. The various modifications described in connection with the embodiment illustrated in Fig. 1 are obviously applicable to the frequency control device of Fig. 2.

It will be noted therefore in connection with the modification of Fig. 2 that there is no real (in-phase) component of transmission through the bridge 5, and the problem of feedback-amplifier stability does not exist to the extent that it does in the Meacham type circuit.

It will be apparent that the embodiments shown are only exemplary and that various modifications can be made in construction and arrangement within the scope of invention as defined in the appended claims.

What is claimed is:

1. A frequency-stabilized electronic oscillator comprising a frequency-determining circuit, phase sensitive signal amplifying means coupled thereto, a balanced bridge, a portion of said bridge forming part of said frequency-determining circuit, a second high-gain amplifier of moderate phase stability connected to receive the output of said bridge, and means responsive to frequency variations in said frequency determining circuit connecting the output of said second amplifier to said first amplifier for exerting a reactive phase compensating control effect on said first amplifier.

2. A frequency-stabilized electronic oscillator comprising a first phase sensitive signal amplifying means, a balanced bridge circuit including a frequency determining means connected between the output and input of said first amplifier, a feedback circuit connected between the output of said bridge and the input of said first amplifier comprising a second, high-gain amplifier of moderate phase stability and responsive to frequency variations in said frequency determining circuit and means controlled by said second amplifier for exerting a reactive phase compensating effect on said first amplifier.

3. A frequency-stabilized electronic oscillator comprising a phase sensitive first signal amplifying means, a balanced bridge circuit including a frequency determining means connected between the output and input of said first amplifier, a second high-gain amplifier of moderate phase stability and responsive to frequency variations in said frequency determining circuit connected to the output of said bridge and variable reactance means responsive to the output of said second amplifier and connected to said first amplifier for controlling the phase output of said first amplifier.

4. The invention as defined in claim 3 in which said variable reactance control comprises, a discriminator responsive to the output of said first and second amplifiers, said discriminator including means tuned to the resonant frequency of the oscillator and means for manifesting a control signal proportional to the deviation from said resonant frequency, and a reactance tube responsive to said control signal.

5. The invention as defined in claim 1 in which said bridge is normally balanced at the resonant frequency of said frequency determining network and said second amplifier is energized by said bridge output only when deviation from said resonant frequency occurs.

References Cited in the file of this patent

UNITED STATES PATENTS

| | | |
|---|---|---|
| 2,611,873 | Gager et al. | Sept. 23, 1952 |
| 2,782,311 | Colander et al. | Feb. 19, 1957 |